US012765381B2

(12) United States Patent
Liu et al.

(10) Patent No.: US 12,765,381 B2
(45) Date of Patent: Oct. 13, 2026

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Shuai-Lin Liu, Taichung City (TW); Nai-Hao Kao, Taichung City (TW); Yu-Po Wang, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 374 days.

(21) Appl. No.: 18/330,233

(22) Filed: Jun. 6, 2023

(65) Prior Publication Data

US 2024/0274505 A1 Aug. 15, 2024

(30) Foreign Application Priority Data

Feb. 13, 2023 (TW) ................................ 112105031

(51) Int. Cl.
*H10W 40/77* (2026.01)
*H10W 74/01* (2026.01)
(Continued)

(52) U.S. Cl.
CPC ....... *H10W 40/778* (2026.01); *H10W 74/014* (2026.01); *H10W 74/019* (2026.01);
(Continued)

(58) Field of Classification Search
CPC . H01L 23/4334; H01L 21/561; H01L 21/568; H01L 24/19; H01L 24/20; H01L 25/0655; H01L 25/16; H01L 24/32; H01L 2224/19; H01L 2224/211; H01L 2224/214; H01L 2224/215; H01L 2224/32225; H01L 2924/01029
See application file for complete search history.

(56) References Cited

U.S. PATENT DOCUMENTS

2009/0294947 A1* 12/2009 Tain .................... H01L 25/0657 257/713
2013/0056871 A1* 3/2013 Yu .......................... H05K 1/181 257/E23.101

(Continued)

*Primary Examiner* — Jacob Y Choi
*Assistant Examiner* — Neil R Prasad
(74) *Attorney, Agent, or Firm* — Studebaker Brackett PLLC

(57) ABSTRACT

An electronic package and a manufacturing method thereof are provided, in which a first electronic element and a second electronic element are embedded in an encapsulation layer, and a circuit structure is disposed on the encapsulation layer and electrically connected to the first electronic element and the second electronic element. The circuit structure has a hollow area corresponding to the first electronic element, and a heat dissipation structure is disposed in the hollow area to thermally connect the first electronic element. Therefore, the heat energy generated by the first electronic element can be quickly dissipated to the outside via the heat dissipation structure, so as to avoid the problem of affecting the operation of the second electronic element due to the overheating of the encapsulation layer.

18 Claims, 7 Drawing Sheets

(51) Int. Cl.

| | |
|---|---|
| ***H10W 90/00*** | (2026.01) |
| *H10W 70/09* | (2026.01) |
| *H10W 70/60* | (2026.01) |
| *H10W 70/652* | (2026.01) |

(52) U.S. Cl.

CPC ............ *H10W 90/00* (2026.01); *H10W 70/09* (2026.01); *H10W 70/60* (2026.01); *H10W 70/6528* (2026.01); *H10W 90/734* (2026.01)

(56) References Cited

U.S. PATENT DOCUMENTS

| | | | | |
|---|---|---|---|---|
| 2019/0237373 | A1* | 8/2019 | Huang ................... | H05K 1/185 |
| 2020/0144192 | A1* | 5/2020 | Choi ........................ | H01L 23/13 |
| 2024/0055385 | A1* | 2/2024 | Hsieh ....................... | H01L 24/30 |

* cited by examiner

ELECTRONIC PACKAGE AND MANUFACTURING METHOD THEREOF

BACKGROUND

1. Technical Field

The present disclosure relates to a semiconductor packaging process, and more particularly, to an electronic package with a heat dissipation mechanism and a manufacturing method thereof.

2. Description of Related Art

With the vigorous development of the electronic industry, electronic products are gradually developing towards multi-functional and high-performance trends. There are many technologies currently used in the field of chip packaging, such as chip scale package (CSP), direct chip attached (DCA), or multi-chip module (MCM) and other flip-chip packaging modules.

FIG. 1 is a schematic cross-sectional view of a conventional semiconductor package 1. As shown in FIG. 1, in the conventional semiconductor package 1, a plurality of semiconductor chips 10, 11 are spaced apart and disposed on a package substrate 13 via a plurality of conductive bumps 14, so that a gap A is formed between any two adjacent ones of the semiconductor chips 10, 11, and then the conductive bumps 14 are covered with an underfill 15, and the semiconductor chips 10, 11 and the underfill 15 are covered with an encapsulation layer 12. Due to the characteristics of packaging multiple semiconductor chips 10, 11 into a chip module, the semiconductor package 1 has a larger number of I/Os. Accordingly, the computing power of the processor has been greatly increased, and the delay time of signal transmission has been reduced, so that the semiconductor package 1 can be applied to high-end products with high-density circuits/high transmission speed/high stacking number/large-sized design.

However, in the conventional semiconductor package 1, the semiconductor chip 10 with a high computing function, such as a System-On-Chip (SoC), will generate a large amount of heat during operation. Therefore, when the semiconductor chips 10, 11 with different functions are integrated in the same encapsulation layer 12, the heat generated by the semiconductor chip 10 with high computing function will be concentrated in the encapsulation layer 12, thereby causing the encapsulation layer 12 to overheat and affect the operation of the semiconductor chip 11 in other forms (such as memory).

Therefore, how to overcome the problems of the above-mentioned prior art has become an urgent problem to be solved at present.

SUMMARY

In view of the aforementioned shortcomings of the prior art, the present disclosure provides an electronic package, comprising: an encapsulation layer; a first electronic element embedded in the encapsulation layer; a second electronic element embedded in the encapsulation layer and spaced apart from the first electronic element; a circuit structure disposed on the encapsulation layer and electrically connected to the first electronic element and the second electronic element, wherein the circuit structure has a hollow area corresponding to the first electronic element; and a heat dissipation structure disposed in the hollow area and thermally connected to the first electronic element.

The present disclosure also provides a method of manufacturing an electronic package, comprising: embedding a first electronic element and a second electronic element in an encapsulation layer in a manner of being spaced apart from each other; forming a circuit structure on the encapsulation layer to electrically connect the circuit structure to the first electronic element and the second electronic element, wherein the circuit structure has a hollow area corresponding to the first electronic element; and disposing a heat dissipation structure in the hollow area to connect the heat dissipation structure to the first electronic element.

In the aforementioned electronic package and method, the heat dissipation structure includes a heat dissipation member disposed in the hollow area and a heat dissipation material filled in the hollow area. For example, the heat dissipation member is a metal frame. Alternatively, wherein the heat dissipation material is liquid metal.

In the aforementioned electronic package and method, the heat dissipation structure is in a shape of a plug and inserted into the hollow area.

In the aforementioned electronic package and method, the hollow area penetrates through the circuit structure.

In the aforementioned electronic package and method, the hollow area is free from penetrating through the circuit structure.

In the aforementioned electronic package and method, the heat dissipation structure is extended on the circuit structure.

In the aforementioned electronic package and method, the first electronic element is provided with a heat dissipation body corresponding to the hollow area. For example, the heat dissipation body is a heat sink.

It can be seen from the above that, in the electronic package of the present disclosure and the manufacturing method thereof, by the design of the hollow area of the circuit structure, the heat dissipation structure can thermally connect the first electronic element to enhance the heat dissipation effect of the first electronic element. Therefore, compared with the prior art, when the first electronic element has a high computing function, the heat energy generated during the operation of the first electronic element will be dissipated quickly to the outside via the heat dissipation structure to avoid the problem of affecting the operation of the second electronic element due to the overheating of the encapsulation layer.

BRIEF DESCRIPTION OF THE DRAWINGS

FIG. 2A, FIG. 2B, FIG. 2C-1, FIG. 2D and FIG. 2E-1 are schematic cross-sectional views illustrating a manufacturing method of an electronic package according to the present disclosure.

FIG. 2C-2 is a schematic partially enlarged top view of FIG. 2C-1.

FIG. 2E-2 is a schematic cross-sectional view showing another aspect of FIG. 2E-1.

DETAILED DESCRIPTION

The following describes the implementation of the present disclosure with examples. Those skilled in the art can easily understand other advantages and effects of the present disclosure from the content disclosed in this specification.

It should be understood that, the structures, ratios, sizes, and the like in the accompanying figures are used for illustrative purposes to facilitate the perusal and comprehension of the content disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical content disclosed in the present specification. Meanwhile, terms such as "on," "above," "upper," "a," "one" and the like are merely used for clear explanation rather than limiting the practicable scope of the present disclosure, and thus, alterations or adjustments of the relative relationships thereof without essentially altering the technical content should still be considered in the practicable scope of the present disclosure.

FIG. 2A, FIG. 2B, FIG. 2C-1, FIG. 2D and FIG. 2E-1 are schematic cross-sectional views illustrating a manufacturing method of an electronic package 2 according to the present disclosure.

Figure 2A:
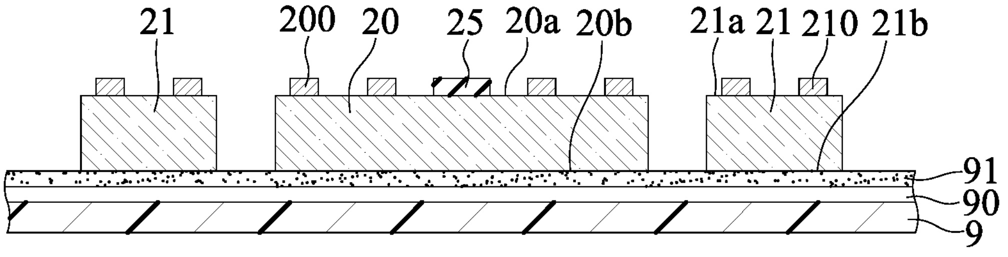

As shown in FIG. 2A, a plurality of first electronic elements 20 and second electronic elements 21 spaced apart from each other are disposed on a carrier 9 of a panel specification or a wafer level specification.

The carrier 9 is a board body made of a semiconductor material (such as silicon or glass) or other board materials, on which an adhesive layer 90 and a release layer 91 are sequentially formed.

The first electronic element 20 is an active element, a passive element, a package structure, or a combination thereof, wherein the active element is such as a semiconductor chip, and the passive element is such as a resistor, a capacitor, or an inductor.

In an embodiment, the first electronic element 20 is a semiconductor chip in the form of a System-On-Chip (SoC), and the first electronic element 20 has an active surface 20*a* and an inactive surface 20*b* opposing the active surface 20*a*. A plurality of electrode pads are formed on the active surface 20*a*, wherein a conductive bump 200 is formed on each of the electrode pads, and the first electronic element 20 is bonded to the release layer 91 via the inactive surface 20*b*. For example, the conductive bump 200 is a metal pillar (such as a copper pillar), a solder material, or a combination thereof.

Furthermore, a heat dissipation body 25 can be provided on the active surface 20*a* of the first electronic element 20 according to requirements. For example, the heat dissipation body 25 is in the form of a heat sink (e.g., a heat dissipation sheet), and the shape of the heat dissipation body 25 can be designed according to requirements, such as various geometric shapes shown in FIG. 4A to FIG. 4F, and the present disclosure is not limited to as such. It should be understood that some of the electrode pads or conductive bumps of the first electronic element 20 can be used as heat dissipation pads or heat dissipation bumps, so that there is no need to add additional heat dissipation bodies 25 in the form of heat sinks.

The second electronic element 21 is an active element, a passive element, a package structure, or a combination thereof, wherein the active element is such as a semiconductor chip, and the passive element is such as a resistor, a capacitor, or an inductor.

In an embodiment, the second electronic element 21 is a semiconductor chip in the form of a memory, and the second electronic element 21 has an active surface 21*a* and an inactive surface 21*b* opposing the active surface 21*a*. A plurality of electrode pads are formed on the active surface 21*a*, wherein a conductive bump 210 is formed on each of the electrode pads, and the second electronic element 21 is bonded to the release layer 91 via the inactive surface 21*b*. For example, the conductive bump 210 is a metal pillar (such as a copper pillar), a solder material, or a combination thereof.

It should be understood that, based on the form of a chip, the width of the first electronic element 20 is greater than the width of the second electronic element 21.

Figure 2B:
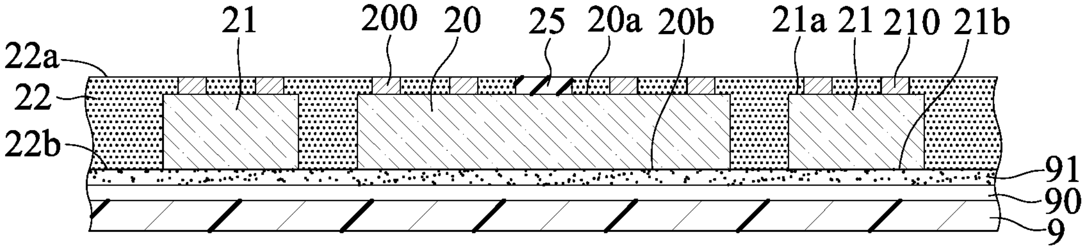

As shown in FIG. 2B, an encapsulation layer 22 is formed on the release layer 91 of the carrier 9 to cover the first electronic element 20 and the second electronic element 21, wherein the encapsulation layer 22 has a first surface 22*a* and a second surface 22*b* opposing the first surface 22*a*, so that the encapsulation layer 22 is bonded onto the release layer 91 via the second surface 22*b*.

In an embodiment, the encapsulation layer 22 is made of an insulating material, such as polyimide (PI), dry film, epoxy resin, molding compound, or other suitable packaging materials. For example, the encapsulation layer 22 is formed on the carrier 9 by lamination or molding.

Moreover, partial materials of the first surface 22*a* of the encapsulation layer 22 can be removed by a leveling process or a thinning process, so that the heat dissipation body 25, the conductive bumps 200 on the active surface 20*a* of the first electronic element 20, the conductive bumps 210 on the active surface 21*a* of the second electronic element 21 and the first surface 22*a* of the encapsulation layer 22 are coplanar, such that the heat dissipation body 25 and the conductive bumps 200, 210 (or the active surface 20*a* of the first electronic element 20 and the active surface 21*a* of the second electronic element 21) are exposed from the encapsulation layer 22. For example, when forming the encapsulation layer 22 on the carrier 9, the encapsulation layer 22 covers the active surface 20*a* of the first electronic element 20 and the active surface 21*a* of the second electronic element 21 and the conductive bumps 200, 210 thereon, and then partial materials of the encapsulation layer 22 are removed by grinding or cutting (partial materials of the heat dissipation body 25 and the conductive bumps 200, 210 can also be removed at the same time according to the requirements), so that the heat dissipation body 25 and the conductive bumps 200, 210 (or the active surface 20*a* of the first electronic element 20 and the active surface 21*a* of the second electronic element 21) are flush with the first surface 22*a* of the encapsulation layer 22.

Figures 1, 2C:
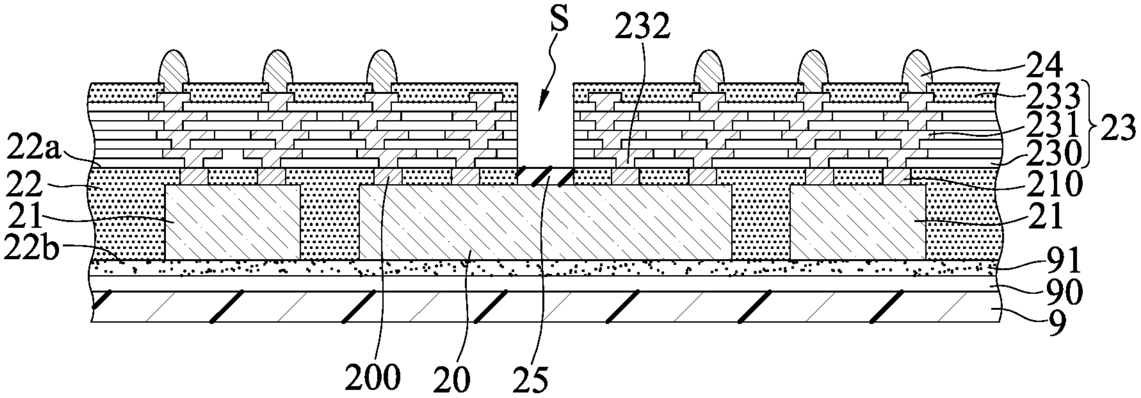
Figures 2, 2C:
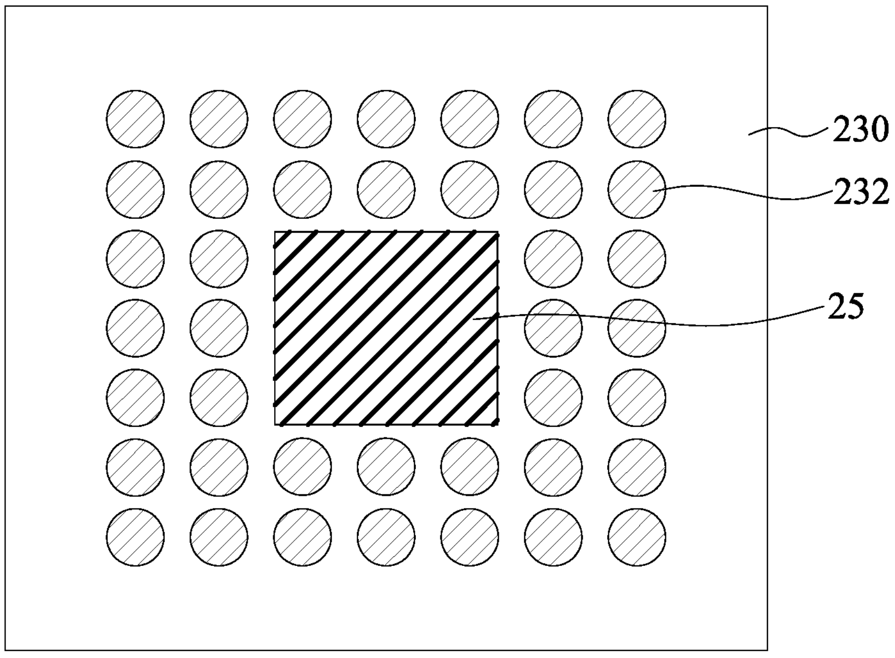
Figure 2D:
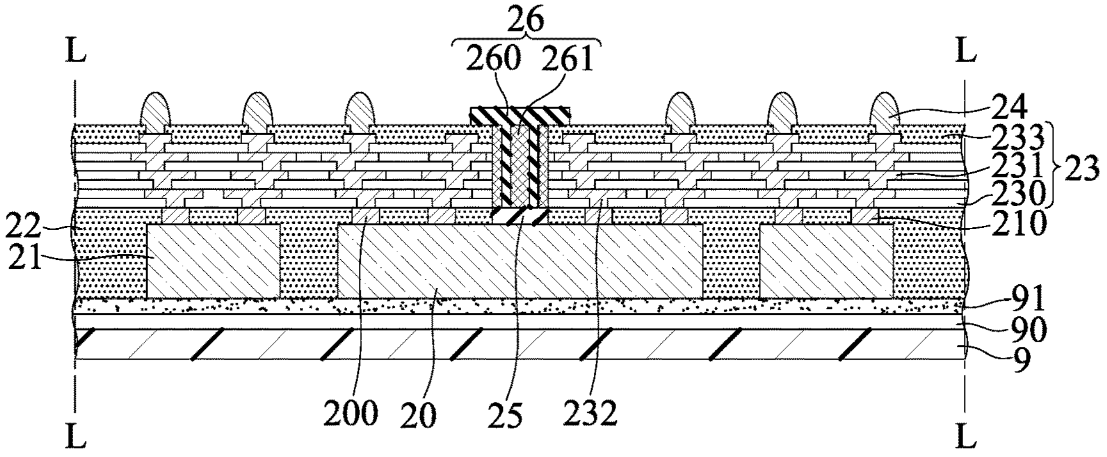
Figures 1, 2E:
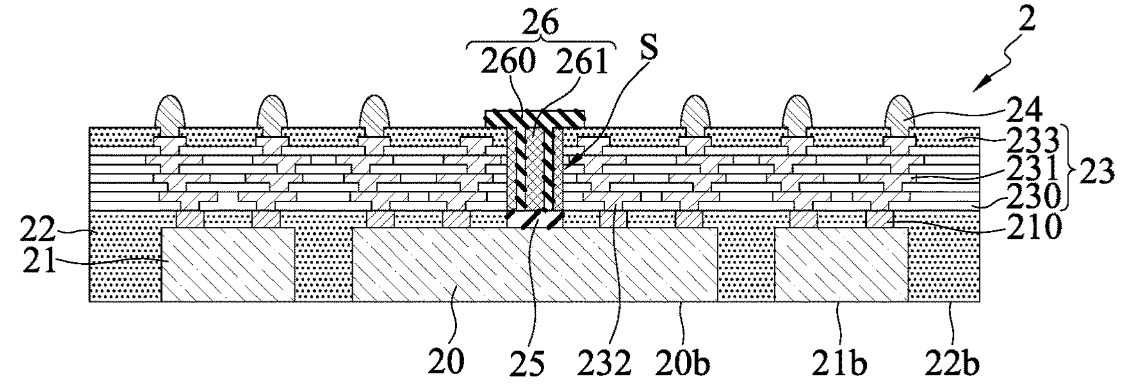
Figures 2, 2E:
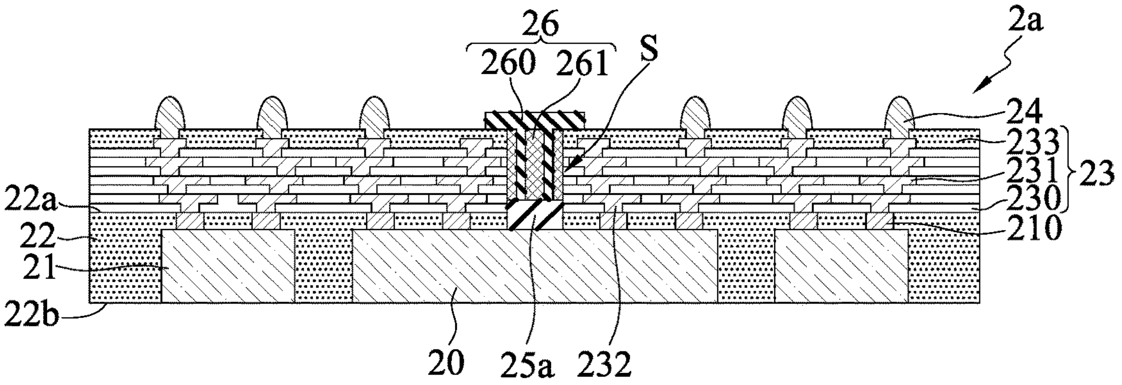

It should be understood that the degree of thinning of the first surface 22*a* of the encapsulation layer 22 can be designed according to requirements, so that a heat dissipation body 25*a* protrudes from the first surface 22*a* of the encapsulation layer 22 (as shown in an electronic package 2*a* of FIG. 2E-2).

Figure 1:
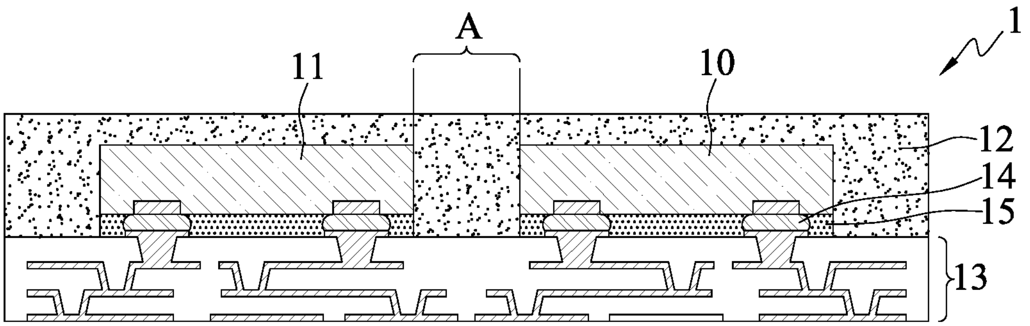
FIG. 1 (PRIOR ART)
FIG. 1 is a schematic cross-sectional view of a conventional semiconductor package.

As shown in FIG. 2C-1, a circuit structure 23 having a hollow area S is formed on the encapsulation layer 22, so that the circuit structure 23 is electrically connected to the conductive bumps 200 of the first electronic element 20 and the conductive bumps 210 of the second electronic element 21, and the hollow area S corresponds to the heat dissipation body 25 (or the active surface 20*a* of the first electronic element 20), so that the heat dissipation body 25 is exposed from the hollow area S.

In an embodiment, the circuit structure 23 comprises at least one insulating layer 230, a circuit layer 231 formed on the insulating layer 230, and a plurality of conductive blind vias 232 formed in the insulating layer 230 and electrically connected to the conductive bumps 200, 210 and the circuit layer 231, wherein the outermost insulating layer 233 can be used as a solder resist layer, and the outermost circuit layer 231 is exposed from the solder resist layer to be bonded to a plurality of conductive elements 24 containing solder materials. For example, the circuit structure 23 is formed by manufacturing a redistribution layer (RDL), wherein the material for forming the circuit layer 231 is copper, and the material for forming the insulating layer 230 is such as polybenzoxazole (PBO), polyimide (PI), prepreg (PP), or other dielectric materials.

Furthermore, at the innermost insulating layer 230, the conductive blind vias 232 surround the heat dissipation body 25, as shown in FIG. 2C-2.

Also, the hollow area S penetrates through the circuit structure 23. Alternatively, if the heat dissipation body 25*a* protrudes from the first surface 22*a* of the encapsulation layer 22, as shown in FIG. 2E-2, the hollow area S may be free from penetrating through the circuit structure 23.

As shown in FIG. 2D, a heat dissipation structure 26 is disposed in the hollow area S, so that the heat dissipation structure 26 is thermally connected to the heat dissipation body 25 (or the active surface 20*a* of the first electronic element 20).

In an embodiment, the heat dissipation structure 26 includes a heat dissipation member 260 and a heat dissipation material 261, wherein the heat dissipation member 260 is like a metal frame, which is inserted into the hollow area S to contact the heat dissipation body 25 (or the active surface 20*a* of the first electronic element 20). For example, the heat dissipation member 260 includes a top sheet and a plurality of pillars connected to the top sheet. The shape of the top sheet of the heat dissipation member 260 can be designed according to requirements, such as various geometric shapes shown in FIG. 4A to FIG. 4F, and the present disclosure is not limited to as such. It should be understood that the shape of the top sheet of the heat dissipation member 260 and the shape of the heat dissipation body 25 may be the same or different.

Figure 3A:
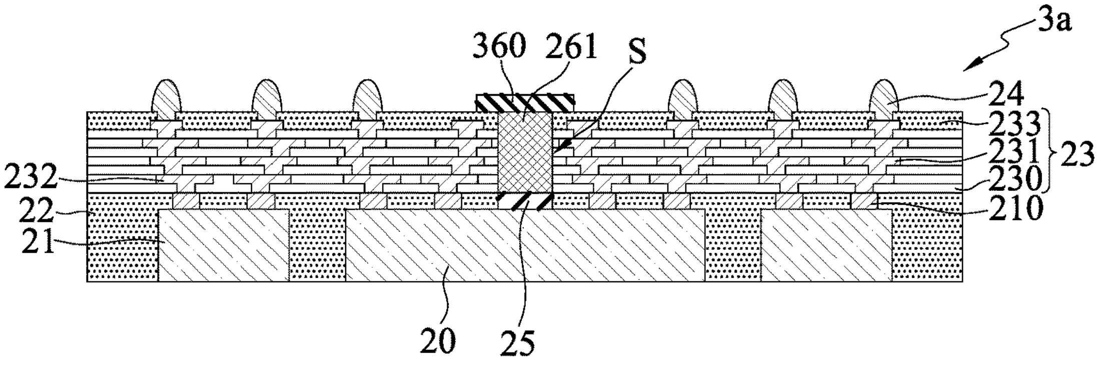
FIG. 3A, FIG. 3B and FIG. 3C are schematic cross-sectional views showing other different embodiments of FIG. 2E-1.

Furthermore, the heat dissipation member 260 is inserted into the hollow area S with a thinner pillar, so the heat dissipation material 261 can be filled into the hollow area S first to fill up the hollow area S, and then the heat dissipation member 260 can be inserted. For example, the heat dissipation material 261 may use liquid metal or other fluids (such as silver glue or copper paste) as a thermal interface material (TIM). Alternatively, in an electronic package 3*a* shown in FIG. 3A, a heat dissipation member 360 is in the form of a metal sheet, which covers the hollow area S. Therefore, the heat dissipation material 261 can be filled first in the hollow area S, so that the heat dissipation material 261 contacts the heat dissipation body 25 (or the active surface 20*a* of the first electronic element 20), and then the heat dissipation member 360 covers the hollow area S.

Figure 3B:
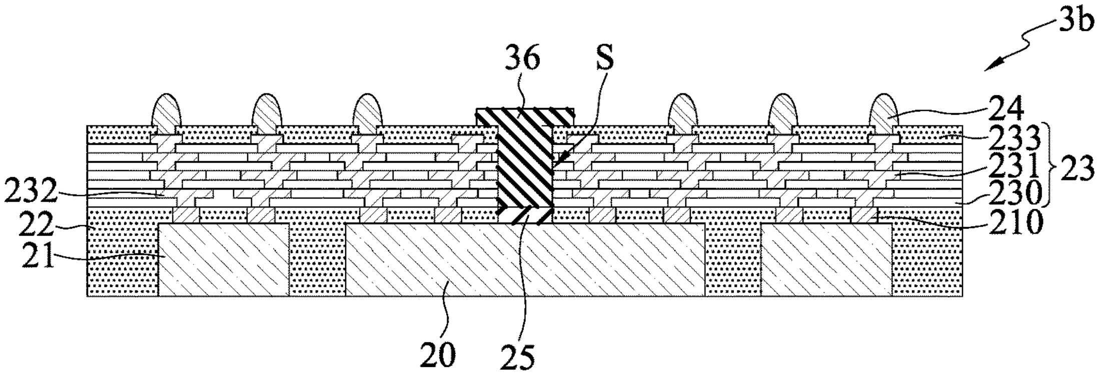

Also, in another embodiment, a heat dissipation structure 36 may also be a metal plug. In an electronic package 3*b* shown in FIG. 3B, the heat dissipation structure 36 is inserted into and fills the hollow area S with a thicker pillar, so that the heat dissipation structure 36 is in contact with the heat dissipation body 25 (or the active surface 20*a* of the first electronic element 20), thereby not requiring the heat dissipation material 261. For example, the shape of an end surface of the heat dissipation structure 36 can be designed according to requirements, such as various geometric shapes shown in FIG. 4A to FIG. 4F, and the present disclosure is not limited to as such. It should be understood that the shape of the end surface of the heat dissipation structure 36 and the shape of the heat dissipation body 25 may be the same or different.

Figure 3C:
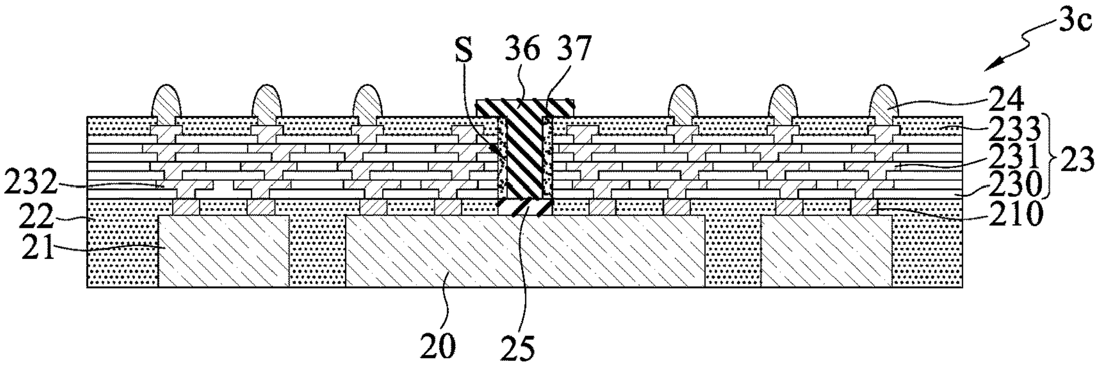
Figure 4A:
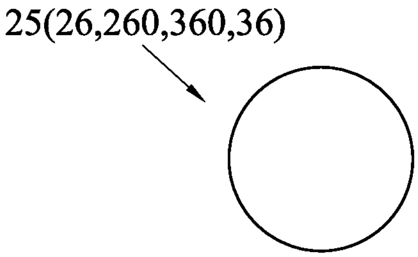
FIG. 4A to FIG. 4F are schematic top views showing various shapes of a heat dissipation component of FIG. 2E-1.
Figure 4B:
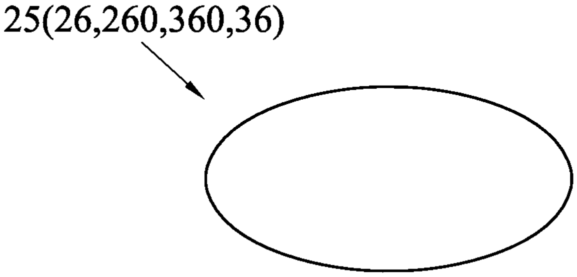
Figure 4C:
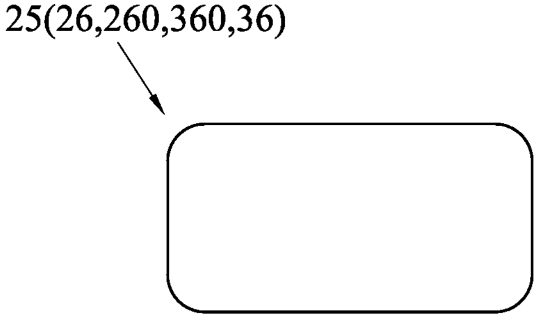
Figure 4D:
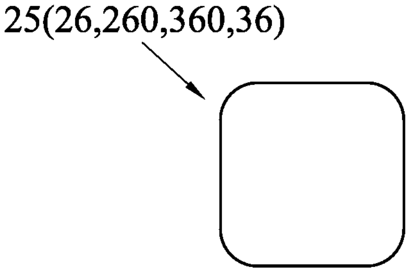
Figure 4E:
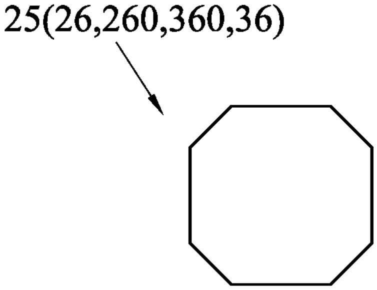
Figure 4F:
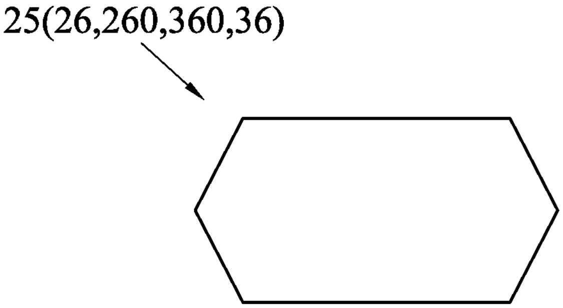

Further, in an electronic package 3*c* shown in FIG. 3C, a bonding material 37 such as heat dissipation glue can be first formed on a wall surface of the hollow area S so as to fix the heat dissipation structure 36. Therefore, there are various forms of the heat dissipation structure, which can be designed according to requirements, and are not limited to the above.

As shown in FIG. 2E-1, the carrier 9 and the adhesive layer 90 and the release layer 91 thereon are removed to expose the second surface 22*b* of the encapsulation layer 22, the inactive surface 20*b* of the first electronic element 20 and the inactive surface 21*b* of the second electronic element 21, and a singulation process is performed along a cutting path L shown in FIG. 2D to obtain a plurality of the electronic packages 2.

Figure 2F:
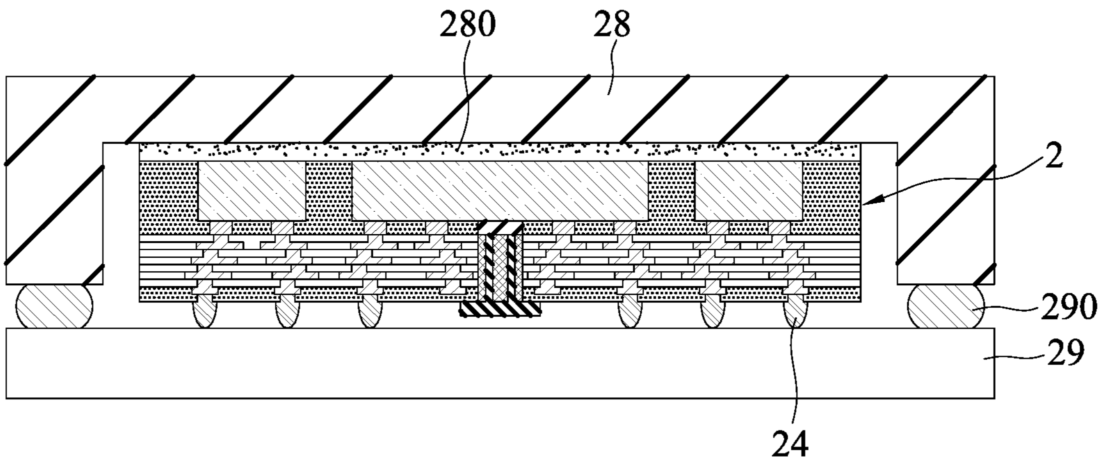
FIG. 2F is a schematic cross-sectional view illustrating the subsequent process of FIG. 2E-1.

As shown in FIG. 2F, in an embodiment, in the subsequent process, the electronic package 2 can be disposed onto an electronic device 29 such as a circuit board via the conductive elements 24. Further, a heat dissipation frame 28 can be disposed onto the electronic device 29 via an adhesive material 290 such as solder or glue, and the heat dissipation frame 28 contacts and bonds to the second surface 22*b* of the encapsulation layer 22, the inactive surface 20*b* of the first electronic element 20 and the inactive surface 21*b* of the second electronic element 21 via a thermally conductive layer 280 as a thermal interface material (TIM).

Therefore, in the manufacturing method of the present disclosure, by the design of the hollow area S of the circuit structure 23, the heat dissipation structure 26, 36 can thermally connect the active surface 20*a* of the first electronic element 20 to enhance the heat dissipation effect of the first electronic element 20. Therefore, compared with the prior art, when the first electronic element 20 has a high computing function, the heat energy generated during the operation of the first electronic element 20 will be dissipated quickly to the outside via the heat dissipation structure 26, 36 to avoid the problem of affecting the operation of the second electronic element 21 due to the overheating of the encapsulation layer 22.

The present disclosure further provides an electronic package 2, 2*a*, 3*a*, 3*b*, 3*c*, comprising: an encapsulation layer 22, a first electronic element 20 embedded in the encapsulation layer 22, a second electronic element 21 embedded in the encapsulation layer 22, a circuit structure 23 disposed on the encapsulation layer 22, and a heat dissipation structure 26, 36.

The second electronic element 21 is embedded in the encapsulation layer 22 in a manner of being spaced apart from the first electronic element 20.

The circuit structure 23 is electrically connected to the first electronic element 20 and the second electronic element 21, wherein the circuit structure 23 has a hollow area S corresponding to the first electronic element 20.

The heat dissipation structure 26, 36 is disposed in the hollow area S to thermally connect the first electronic element 20.

In one embodiment, the heat dissipation structure 26 includes a heat dissipation member 260, 360 disposed on the hollow area S and a heat dissipation material 261 filled in the hollow area S. For example, the heat dissipation member 260, 360 is a metal frame. Alternatively, the heat dissipation material 261 is liquid metal.

In one embodiment, the heat dissipation structure 36 is in the shape of a plug and is inserted into the hollow area S.

In one embodiment, the hollow area S penetrates through or is free from penetrating through the circuit structure 23.

In one embodiment, the heat dissipation structure 26, 36 is extended on the circuit structure 23.

In one embodiment, the first electronic element 20 is provided with a heat dissipation body 25, **25*a* corresponding to the hollow area S. For example, the heat dissipation body 25, 25*a*** is a heat sink.

To sum up, in the electronic package of the present disclosure and the manufacturing method thereof, by the design of the hollow area of the circuit structure, the heat dissipation structure can thermally connect the first electronic element to enhance the heat dissipation effect of the first electronic element. Therefore, when the first electronic element has a high computing function, the heat energy generated during the operation of the first electronic element will be dissipated quickly to the outside via the heat dissipation structure to avoid the problem of affecting the operation of the second electronic element due to the overheating of the encapsulation layer.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. An electronic package, comprising:
an encapsulation layer;
a first electronic element embedded in the encapsulation layer;
a second electronic element embedded in the encapsulation layer and spaced apart from the first electronic element;
a circuit structure disposed on the encapsulation layer and electrically connected to the first electronic element and the second electronic element, wherein the circuit structure has a hollow area corresponding to the first electronic element; and
a heat dissipation structure disposed in the hollow area and thermally connected to the first electronic element, wherein a heat dissipation body is disposed in the hollow area and between the first electronic element and the heat dissipation structure, and wherein the heat dissipation structure comprises a plurality of pillars contacted to the heat dissipation body.

2. The electronic package of claim 1, wherein the heat dissipation structure includes a heat dissipation member disposed in the hollow area and a heat dissipation material filled in the hollow area.

3. The electronic package of claim 2, wherein the heat dissipation member is a metal frame.

4. The electronic package of claim 2, wherein the heat dissipation material is liquid metal.

5. The electronic package of claim 1, wherein the heat dissipation structure is in a shape of a plug and inserted into the hollow area.

6. The electronic package of claim 1, wherein the hollow area penetrates through the circuit structure.

7. The electronic package of claim 1, wherein the hollow area is free from penetrating through the circuit structure.

8. The electronic package of claim 1, wherein the heat dissipation structure is extended on the circuit structure.

9. The electronic package of claim 1, wherein the heat dissipation body is a heat sink.

10. A method of manufacturing an electronic package, comprising:
embedding a first electronic element and a second electronic element in an encapsulation layer in a manner of being spaced apart from each other;
forming a circuit structure on the encapsulation layer to electrically connect the circuit structure to the first electronic element and the second electronic element, wherein the circuit structure has a hollow area corresponding to the first electronic element; and
disposing a heat dissipation structure in the hollow area to connect the heat dissipation structure to the first electronic element, wherein a heat dissipation body is disposed on the first electronic element and in the hollow area, and wherein the heat dissipation structure comprises a plurality of pillars contacted to the heat dissipation body.

11. The method of claim 10, wherein the heat dissipation structure includes a heat dissipation member disposed in the hollow area and a heat dissipation material filled in the hollow area.

12. The method of claim 11, wherein the heat dissipation member is a metal frame.

13. The method of claim 11, wherein the heat dissipation material is liquid metal.

14. The method of claim 10, wherein the heat dissipation structure is in a shape of a plug and inserted into the hollow area.

15. The method of claim 10, wherein the hollow area penetrates through the circuit structure.

16. The method of claim 10, wherein the hollow area is free from penetrating through the circuit structure.

17. The method of claim 10, wherein the heat dissipation structure is extended on the circuit structure.

18. The method of claim 10, wherein the heat dissipation body is a heat sink.

* * * * *